(12) United States Patent
Sakaya et al.

(10) Patent No.: US 7,410,831 B2
(45) Date of Patent: Aug. 12, 2008

(54) METHOD AND DEVICE FOR DIVIDING PLATE-LIKE MEMBER

(75) Inventors: Yasuyuki Sakaya, Mitaka (JP); Masayuki Azuma, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 218 days.

(21) Appl. No.: 10/555,448

(22) PCT Filed: Apr. 30, 2004

(86) PCT No.: PCT/JP2004/006321

§ 371 (c)(1), (2), (4) Date: Nov. 3, 2005

(87) PCT Pub. No.: WO2004/100240

PCT Pub. Date: Nov. 18, 2004

(65) Prior Publication Data

US 2006/0211220 A1 Sep. 21, 2006

(30) Foreign Application Priority Data

May 12, 2003 (JP) ............................ 2003-132573

(51) Int. Cl.
*H01L 21/50* (2006.01)
*H01L 21/48* (2006.01)
*H01L 21/44* (2006.01)
*H01L 21/78* (2006.01)
*H01L 21/46* (2006.01)
*H01L 21/301* (2006.01)

(52) U.S. Cl. ....................... 438/113; 438/114; 438/460; 438/463

(58) Field of Classification Search ................. 438/113, 438/114, 460, 463
See application file for complete search history.

(56) References Cited

U.S. PATENT DOCUMENTS

| 6,245,593 B1 * | 6/2001 | Yoshihara et al. ........... 438/106 |
| 6,297,076 B1 * | 10/2001 | Amagai et al. .............. 438/114 |
| 2004/0180473 A1 * | 9/2004 | Kawai ........................ 438/114 |

FOREIGN PATENT DOCUMENTS

JP 6188310 A 7/1994

(Continued)

*Primary Examiner*—Luan Thai
(74) *Attorney, Agent, or Firm*—David S. Safran (57) ABSTRACT

In a method and an apparatus for dividing a plate-like member related to the present invention, multiple substrates are obtained by forming a linear modified region on a surface of a plate-like member formed from a hard and brittle material or in the interior of the plate-like member and dividing the plate-like member along this modified region. The method for dividing a plate-like member includes a tape sticking step which involves sticking tape on the surface of the plate-like member, a modified region forming step which involves forming a modified region on surface of the plate-like member or in the interior of the plate-like member, and an expanding step which involves elongating the tape by applying a tension thereto after the modified region forming step. In the expanding step, the tape is irradiated with UV rays. As a result of this, it is possible to positively manufacture an ultrathin chip with a good end-face shape in which uncut portions, chipping and breakage do not occur.

6 Claims, 9 Drawing Sheets

FOREIGN PATENT DOCUMENTS

| | | | |
|---|---|---|---|
| JP | 2002110588 A | 4/2002 |
| JP | 2002192367 A | 7/2002 |
| JP | 2002192368 A | 7/2002 |
| JP | 2002192369 A | 7/2002 |
| JP | 2002192370 A | 7/2002 |
| JP | 2002192371 A | 7/2002 |
| JP | 2002205180 A | 7/2002 |
| JP | 2002110588 | * 12/2002 |

* cited by examiner

METHOD AND DEVICE FOR DIVIDING PLATE-LIKE MEMBER

TECHNICAL FIELD

The present invention relates to a method and an apparatus for dividing a plate-like member from which chips for semiconductor devices, electronic parts and the like are manufactured and, more particularly, to a method and an apparatus for dividing a plate-like member which are suitable for working a wafer to a prescribed thickness by grinding the back surface of the wafer and thereafter performing working for forming a modified region by laser beams and dividing the wafer into individual chips.

BACKGROUND ART

In recent years, ultrathin IC chips which are built in ultrathin IC cards and the like represented by a smart card have been required. Such ultrathin IC chips are manufactured by dividing an ultrathin wafer of not more than 100 μm into individual chips.

Figure 7:
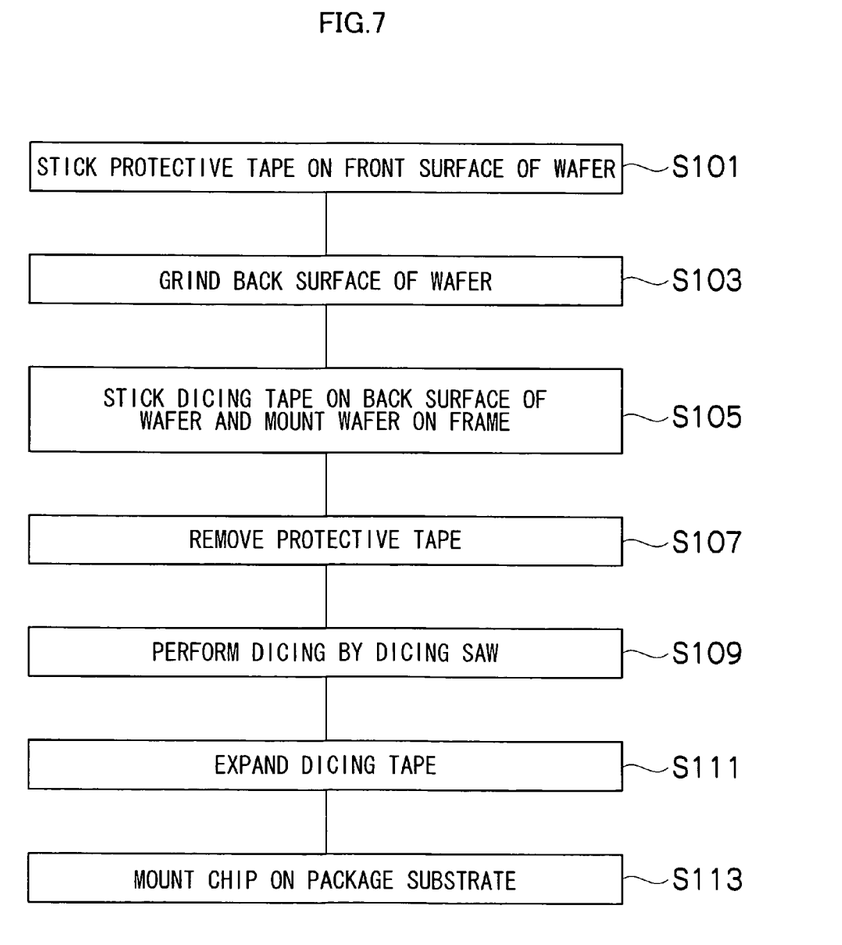
FIG. 7 is a flowchart which shows the flow of a conventional method for dividing a plate-like member.

Against this background, in conventional methods for dividing a plate-like member for semiconductor devices, electronic parts and the like, as shown in the flowchart of FIG. 7, a protective tape sticking step (Step S101) is first performed. In this protective tape sticking step, in order to protect a wafer surface on which may semiconductor devices, electronic parts and the like are formed, a protective tape having an adhesive on its one side is first stuck to a wafer surface. Subsequently, a back surface grinding step (Step S103) is performed. In this back surface grinding step, the wafer is ground from its back surface and worked to a prescribed thickness.

After the back surface grinding step, a frame mounting step is performed which involves mounting the wafer on a dicing frame by use of a dicing tape having an adhesive on its one surface and the wafer and the dicing tape become integrated (Step S105). Subsequently, a protective tape removing step is performed which involves adsorbing the wafer in this condition on the dicing tape side and removing the protective tape stuck to the surface (Step S107).

The wafer from which the protective tape has been removed, along with the frame, is transferred to a dicing saw and cut into individual chips by a diamond blade which rotates at a high speed (Step S109). Subsequently, in the expanding step the dicing tape is radially elongated and the intervals between individual chips are widened (Step S111), and in the chip mounting step the chips are mounted on package substrates such as lead frames (Step S113).

However, in such conventional methods for dividing a plate-like member, it was necessary to use a protective tape for preventing the pollution of a wafer surface during the grinding of the back surface of the wafer and a dicing tape for holding chips after dicing and this lead to an increase in the cost of consumables.

Furthermore, in the case of an ultrathin wafer having a thickness of not more than 100 μm, under conventional methods by which a wafer is cut by use of a dicing saw, chipping and breakage are formed during cutting, thereby posing the problem that good chips become defective products.

As means to solve the problem that chippings and breakage occur in a wafer during cutting, there have been proposed techniques related to a laser processing method which involves, in place of conventional cutting by a dicing saw, causing laser beams to become incident, with a condensing point aligned in the interior of a wafer, forming a modified region in the interior of the wafer by multiphoton absorption, and then dividing the wafer into individual chips (refer to, for example, the Japanese Patent Laid-Open No. 2002-192367, the Japanese Patent Laid-Open No. 2002-192368, the Japanese Patent Laid-Open No. 2002-192369, the Japanese Patent Laid-Open No. 2002-192370, the Japanese Patent Laid-Open No. 2002-192371, and the Japanese Patent Laid-Open No.2002-205180).

However, in the techniques proposed in the above-cited unexamined patent publications, a dicing device by a dividing technique by use of laser beams is proposed in place of a conventional dicing device by a dicing saw, and although the problem that chippings and breakage occur in a wafer during cutting is solved, the problem that in the expanding step, portions which are not divided are formed and end-face shapes of divided chips become poor.

Figure 8:
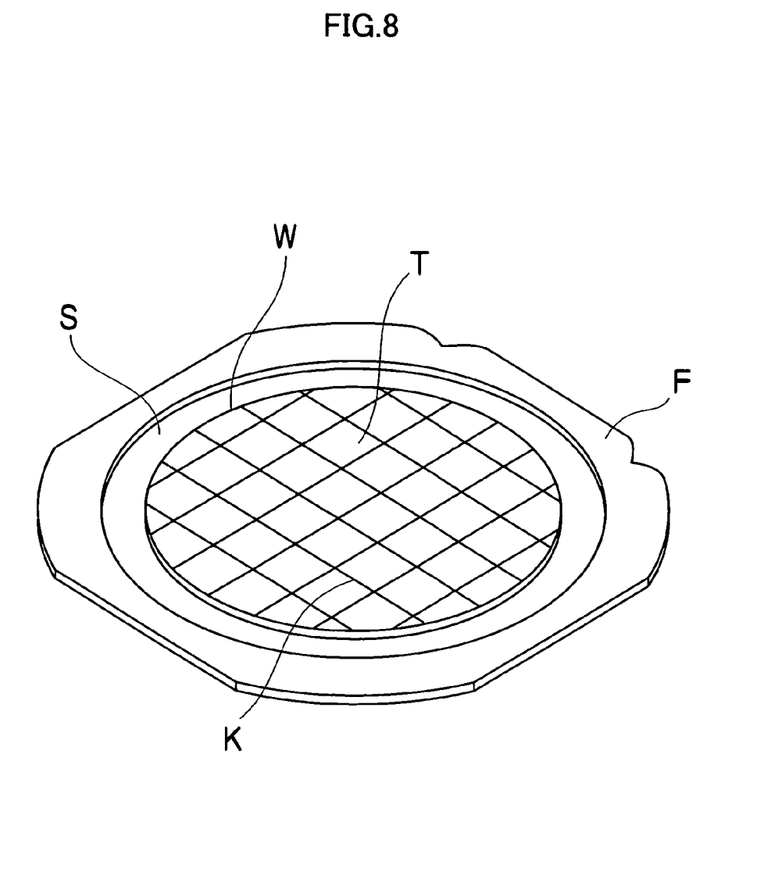
FIG. 8 is a conceptual diagram to explain a conventional expanding step.

FIGS. 8 and 9 are each a conceptual figure to explain this phenomenon. In FIG. 8, a dicing tape S is stuck to the back surface of a wafer W and the peripheral edge portion of the dicing tape S is fixed to a frame F. A modified region K in rectangular arrangement is formed in the wafer W by laser beams. Subsequently, in the expanding step, the dicing tape S is elongated, with the result that the wafer W is divided into multiple chips T, with the modified region serving as starting points.

The elongating of the dicing tape S in the expanding step is performed, for example, by pushing up a cylindrical ring member from below in an annular portion between the frame F of the dicing tape S and the wafer W.

Figure 9A:
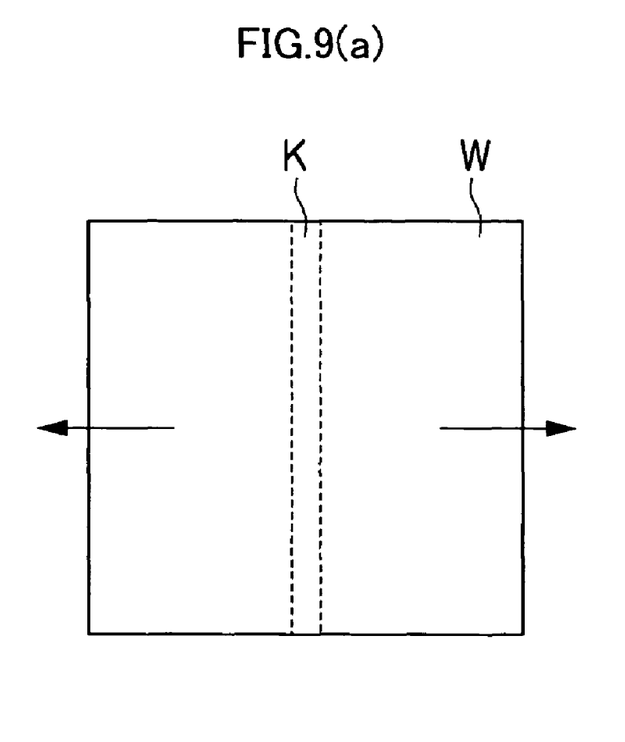
FIGS. 9(a) and 9(b) are each a schematic diagram to explain the division of a wafer in a conventional expand step.
Figure 9B:
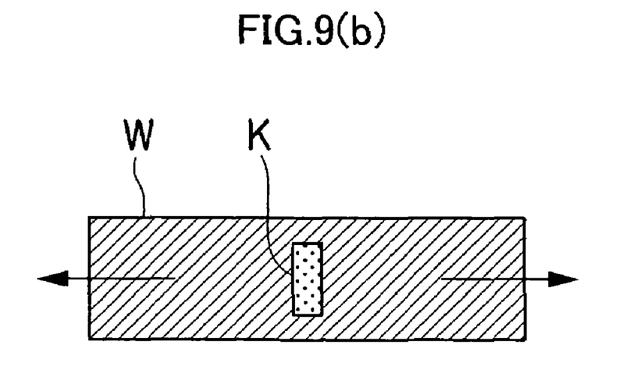

FIG. 9 is a schematic diagram to explain the division of a wafer W in an expanding step. FIG. 9(a) is a plan view and FIG. 9(b) is a sectional view. As shown in FIG. 9(b), a modified region K formed by laser beams is present in the interior of the wafer W. As shown in FIG. 9(a), cutting is performed satisfactorily when a uniform tension is applied to the wafer W.

In conventional methods and apparatus for dividing a plate-like member, however, it is often that in the expanding step, the elongation of the dicing tape S does not become uniform all over the surface of the wafer W. For example, the dicing tape S in a portion where cutting has already been performed is locally elongated, and it becomes impossible to apply a tension to the dicing tape S in uncut portions. As a result, it is often that uncut portions are formed and that the end-face shapes of divided chips do not become linear and become poor.

The present invention has been made in view of such circumstances and has as its object the provision of a method and an apparatus for dividing a plate-like member which can positively manufacture an ultrathin chip with a good end-face shape in which uncut portions, chippings and breakage do not occur when, after working a wafer to a prescribed thickness by grinding the back surface of the wafer, working for forming a modified region by laser beams is performed and the wafer is divided into individual chips.

Also, the present invention has as its another object the provision of a method and an apparatus for dividing a plate-like member which can miniaturize the apparatus for dividing a plate-like member and can perform dividing work of a plate-like member in a short time.

DISCLOSURE OF THE INVENTION

To achieve the above-described objects, the present invention provides a method for dividing a plate-like member formed from a hard and brittle material, which comprises a tape sticking step which involves sticking tape on a surface of the plate-like member, a modified region forming step which involves forming a linear modified region on the surface of the plate-like member to which the tape has been stuck or in the interior thereof, and an expanding step which involves elongating the tape by applying a tension thereto after the modified region forming step and irradiating the tape with UV rays, whereby the plate-like member is divided along the linear modified region thereby to obtain multiple substrates.

Also, to achieve the above-described objects, the present invention provides an apparatus for dividing a plate-like member which is formed from a hard and brittle material and to the surface of which tape is stuck and a liner modified region is formed on the surface of which or in the interior of which along the modified region to obtain several substrates. The apparatus comprises expanding means which applies a tension to the tape and elongates the tape in order to divide the plate-like member along the linear modified region, and UV ray irradiation means which irradiate the tape with UV rays.

According to the present invention, the tape is irradiated with UV rays (light in the wavelength region of ultraviolet rays) during expanding. By irradiation with UV rays, it is possible to cure an adhesive of the tape and to change the adhesion of the tape and, therefore, the elongation of the tape can be made uniform all over the surface of the plate-like member when the tape is elongated by applying a tension thereto. As a result, it is possible to positively manufacture an ultrathin chip with a good end-face shape in which uncut portions, chipping and breakage do not occur when multiple substrates are obtained by dividing the plate-like member along the linear modified region.

Also, according to the present invention, it is necessary only that UV ray irradiation means be added to a conventional device for dividing a plate-like member, and the construction of the apparatus can be made simple. The dividing work of a plate-like member becomes also simple. As a result, it becomes possible to miniaturize the apparatus for dividing a plate-like member and the dividing work of a plate-like member can be performed in a short time.

Incidentally, the linear modified region is not necessarily be a continuous linear one and may be in the form of a broken line such as a dotted line. This is because even in such a broken linear modified region, it is possible to positively manufacture an ultrathin substrate with a good end-face shape in the same way as in a continuous linear modified region.

In the present invention, it is preferred that in the expanding step, the tape be irradiated with UV rays in a pattern by use of a photomask. This is because if the tape is irradiated with UV rays in a pattern like this, by discriminating between the tape in a portion corresponding to the linear modified region of the plate-like member and the tape in other portions, the adhesion of the tape is changed and the cured condition of the adhesive of the tape is changed, whereby the area near the modified region of the plate-like member is selectively expanded and the expanding force of the tape can be efficiently transmitted as a dividing force to the plate-like member, with the result that the object of the present invention that an ultrathin substrate with a good end-face shape is positively manufactured is more easily achieved. Incidentally, in the present invention, a "pattern" refers to a specific pattern which is made on the basis of the size and shape of individual substrates obtained by the dividing of the plate-like member, and an aggregate or array of the specific pattern and which is used to selectively irradiate the tape with UV rays.

In the present invention, it is preferred that in the modified region forming step, the modified region be formed on the surface of the plate-like member or in the interior thereof by causing laser beams to become incident on the plate-like member. This is because the use of laser beams can exhibit superiority in various aspects such as productivity, running cost and quality although methods like dicing, scribing, etc. can be adopted in forming the liner modified region on the surface of the plate-like member.

BEST MODE FOR CARRYING OUT THE INVENTION

Preferred embodiments of a method and an apparatus for dividing a plate-like member related to the present invention will be described below with reference to the accompanying drawings. In this regard, the term "plate-like" is used synonymously with the term "plate-shape" to mean which is in the shape of a plate in the manner of the wafer W shown in the drawings of this application.

Figure 1:
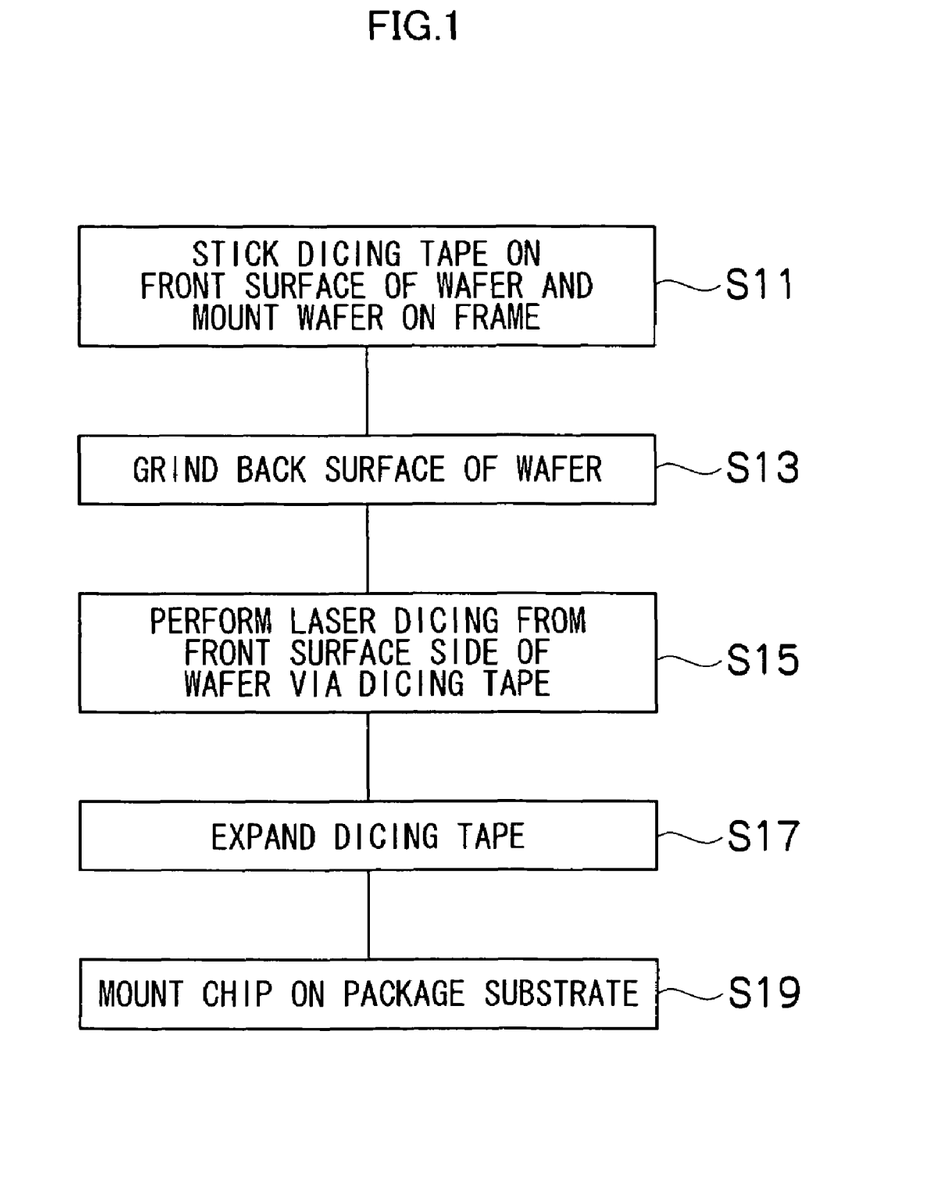
FIG. 1 is a flowchart which shows the flow of the first embodiment of a method for dividing a plate-like member related to the present invention.

FIG. 1 is a flowchart which shows the flow of the first embodiment of a method for dividing a plate-like member related to the present invention. In this first embodiment, first, the back surface side of a wafer on the front surface side of which many IC circuits are formed is placed on a table, and subsequently, a ring-shaped dicing frame is disposed outside the wafer. Subsequently, a dicing tape having an ultraviolet (hereinafter referred to as UV) curing type adhesive on one surface is stuck from above to the frame and the front surface of the wafer, and the wafer is mounted on the frame (Step S11). In this condition, the front surface of the wafer is protected by the dicing tape, and at the same time, the front surface is integrated with the frame, resulting in good transportability (the above description corresponds to the tape sticking step).

Next, the back surface of the wafer is ground by a back grinder to a thickness close to a specified thickness (for example, 50 μm). After the grinding, a work-affected layer generated during grinding is removed by polishing. The back grinder used here is a polish grinder having the function of polishing and can remove the work-modified layer simply by polishing without releasing the adsorption of the wafer after grinding. Therefore, even when the thickness of the wafer is 30 μm or so, the wafer will not be broken. The wafer thus polished is cleaned and dried by a cleaning and drying device provided in the back grounder (Step S13).

Next, the wafer thus worked to a specified thickness is diced by a laser dicing built in the polish grinder having the function of polishing so as to be divided into individual chips. The wafer, along with the frame, is adsorbed by the table and laser beams are caused to become incident from the front surface side of the wafer via the dicing tape. Because a condensing point of the laser beams is set in the interior of the wafer in the thickness direction of the wafer, the laser beams which have transmitted the front surface of the wafer are such that the energy is concentrated on the condensing point in the interior of the wafer and a modified region by multiphoton absorption is formed in the interior of the wafer (the above description corresponds to the modified region forming step). As a result of this, the balance of an intermolecular force in the wafer is disrupted and the wafer becomes naturally cut or becomes cut by a slight outer force (Step S15).

Figure 2:
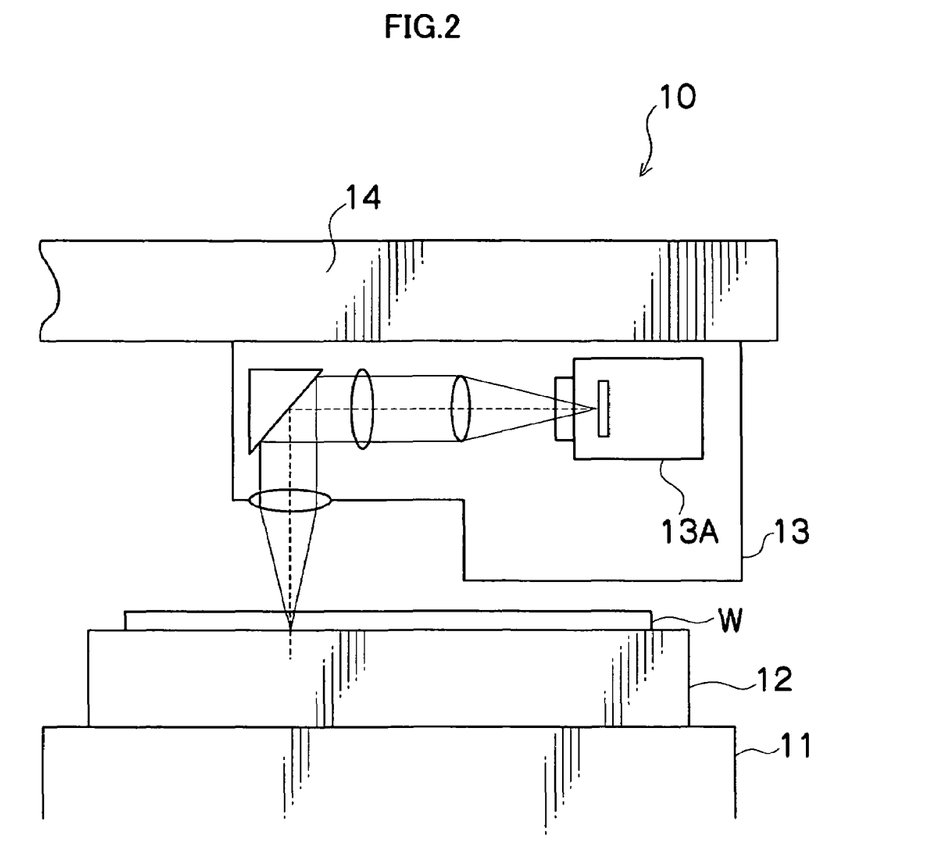
FIG. 2 is a conceptual diagram to explain a laser dicing device.

FIG. 2 is a conceptual diagram to explain a laser dicing device built in a polish grinder. As shown in FIG. 2, in the laser dicing apparatus 10, an XYZ θ ?table 12 is provided on a machine base 11, and the XYZ θ table 12 on which a wafer W is adsorbed and loaded is precisely moved in the XYZ θ direction. An optical system 13 for dicing is provided on a holder 14, which is similarly provided on the machine base 11.

The optical system 13 is provided with a laser beam source 13A, and laser beams oscillated from the laser beam source 13A are condensed in the interior of the wafer W via the optical system of a collimate lens, a mirror, a condenser lens, etc. Laser beams used here have transmission characteristics for a dicing tape under the conditions: the peak power density at the condensing point is not less than $1 \times 10^8$ (W/cm$^2$) and the pulse width is not more than 1 μs. Incidentally, the position of the condensing point in the thickness direction is adjusted by the micromotion of the XYZ θ table 12 in the Z-direction.

The laser dicing device 10 is provided with an observational optical system, which is not shown, and the alignment of the wafer is performed on the basis of a pattern formed on the front surface of the wafer, whereby the incident position of laser beams is determined. After the completion of the alignment, the XYZ θ table 12 moves in the XY-direction and laser beams are caused to become incident along a dicing street of the wafer.

After the laser dicing in Step S15 shown in FIG. 1, the expanding step is performed which involves radially expanding the dicing tape and widening the gap between chips (Step S17). Details of this step will be given later.

With the dicing tape expanded, UV rays are radiated from the dicing tape side, whereby the adhesive of the dicing tape is cured and its adhesion is reduced. Incidentally, this irradiation with UV rays may be performed at the end of the dicing step.

Subsequently, one chip in an expanded condition is pushed up from the dicing tape side and exfoliated from the dicing tape, this chip is sucked by a pickup head and sucked by a collet for chip mounting, with the front and back surfaces reversed, and the chip is mounted on a package substrate, such as a lead frame (Step S19). After the chip mounting step, the packaging step of wire bonding, molding, lead trimming and forming, marking, etc. is performed and an IC is completed. The foregoing is an outline of the first embodiment.

Figure 3:
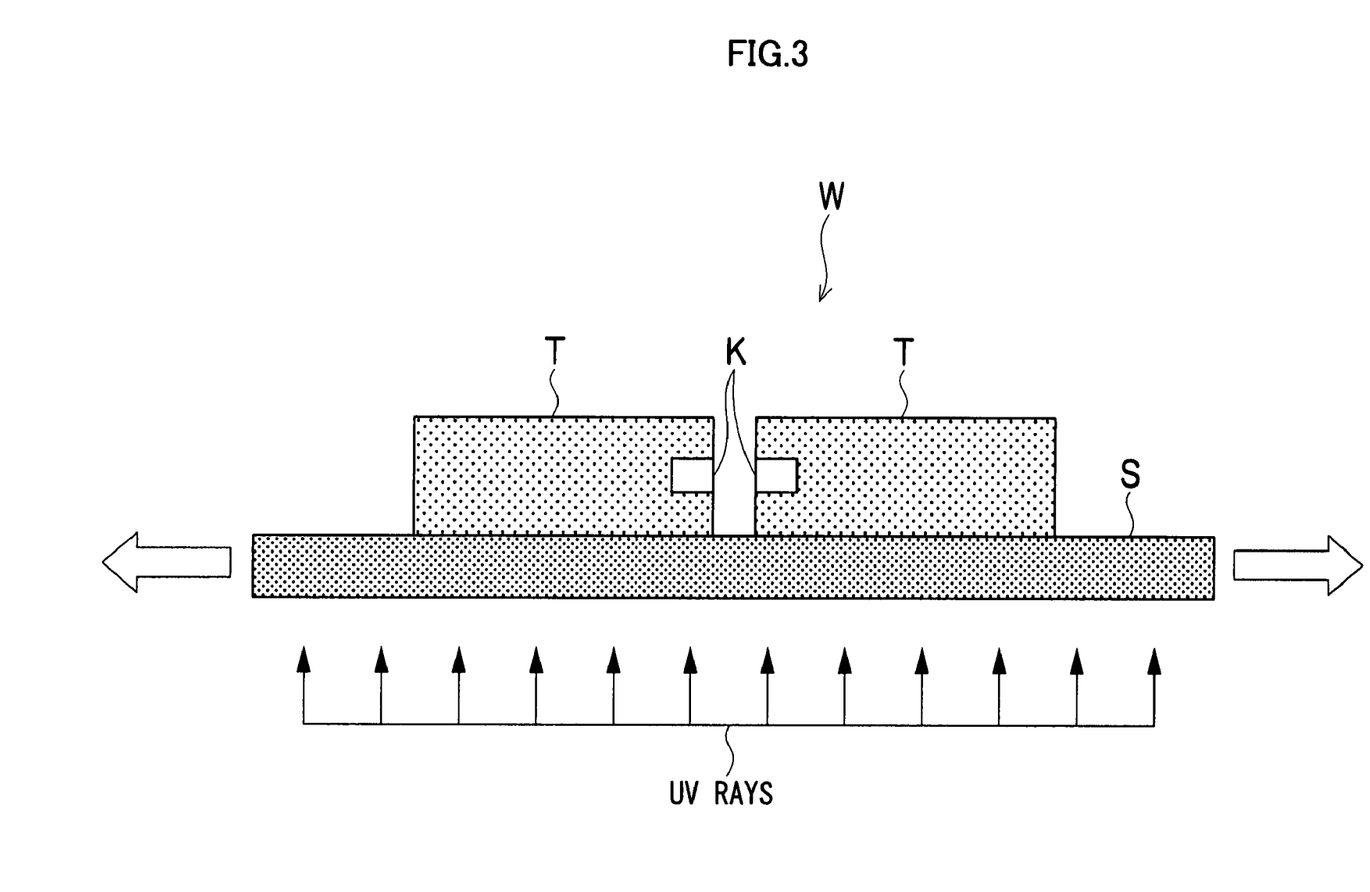
FIG. 3 is a conceptual diagram to explain the principle of a method for dividing a plate-like member related to the present invention.

Next, details of the expanding step will be given. FIG. 3 is a conceptual diagram to explain the principle of a method for dividing a plate-like member related to the present invention, and FIG. 4 is a sectional view which shows an outline of the first embodiment.

As shown in FIG. 3, a modified region K formed by laser beams is present in the interior of a wafer W. As shown in FIG. 3, the tension applied to the wafer W on both sides of the modified region K via the dicing tape S is indicted by arrows in the right and left directions. As indicated by multiple upward arrows, UV rays are radiated from the bottom surface of the dicing tape S to almost the whole surface of the dicing tape S.

Figure 4:
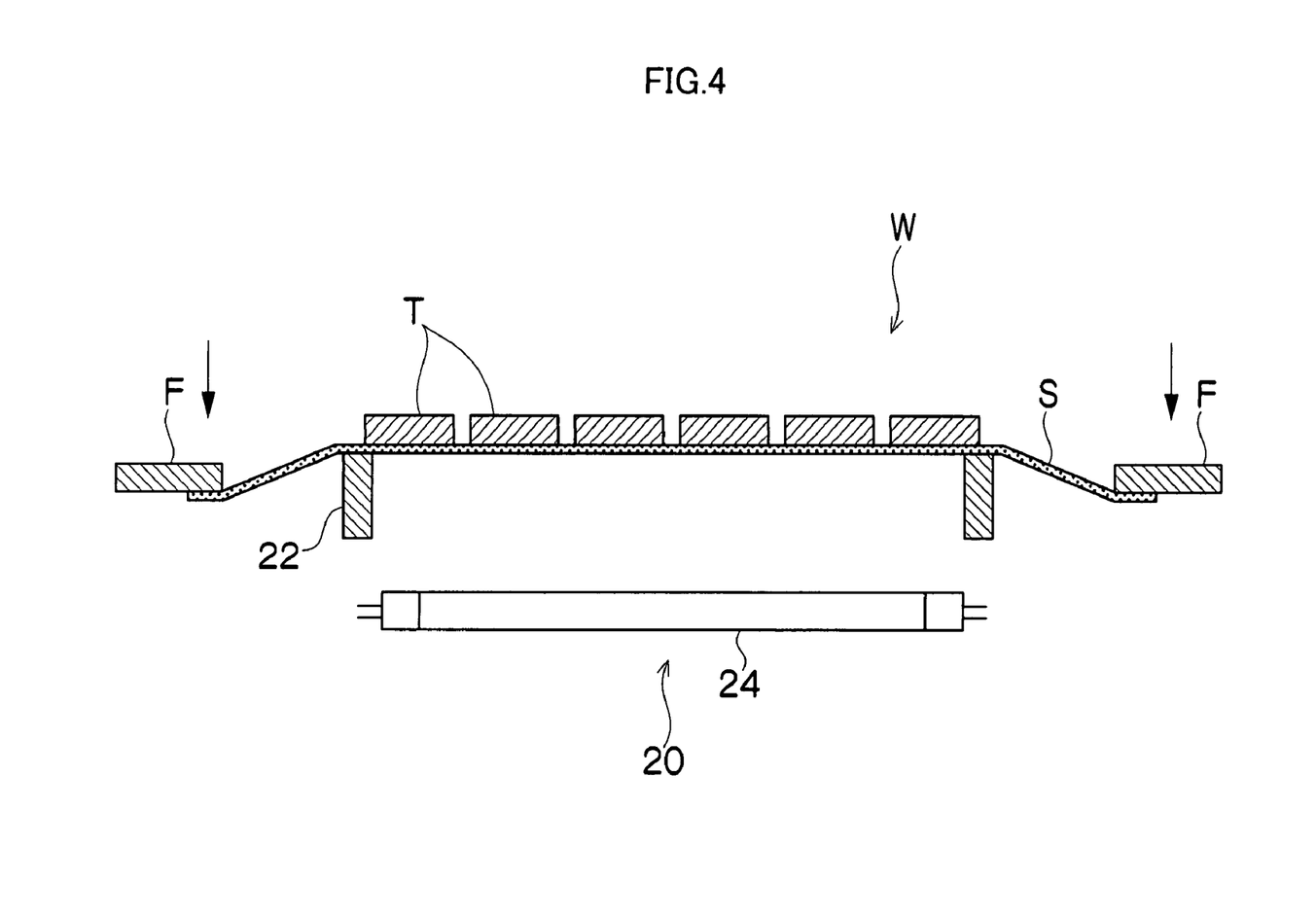
FIG. 4 is a sectional view which shows an outline of the first embodiment of a method for dividing a plate-like member related to the present invention.

FIG. 4 shows a dividing device 20 for performing this dividing method. As shown in FIG. 4 and FIG. 8, which was described above, the peripheral edge portion of the dicing tape S is fixed to the frame F. A ring member 22 abuts against the bottom surface of the inner portion of the peripheral edge portion of the dicing tape S. The top peripheral portion of this ring member 22 is rounded smooth. Below the dicing tape S, there is disposed a UV ray source 24 (UV ray irradiation means).

UV rays are radiated from the UV ray source 24 at the dicing tape S and, at the same time, the frame F is pushed down in the direction of the arrows of FIG. 4. By radiating UV rays, it is possible to cure the adhesive of the dicing tape S and change the adhesion of the tape.

Simultaneously, a force indicated by the arrows of the figure is applied to the frame F, and the frame is pushed down. As a result of this, the dicing tape S is expanded and the gap between chips T is widened. At this time, because the top peripheral edge portion of the ring member 22 is rounded smooth, the dicing tape S is smoothly expanded.

It is possible to adopt publicly known direct-operated devices of various types as a mechanism for pushing down the frame F. For example, it is possible to adopt a direct-operated device which is constituted by cylinder members (by hydraulic pressure, pneumatic pressure, etc.), a motor and screws (a male screw as a shaft and a female screw as a bearing).

For the irradiation conditions with UV rays, such as irradiation capacity (electric power), wavelength range and irradiation time, appropriate values can be selected according to the material quality of the adhesive of the dicing tape S, the size of the wafer W and the size of chips T after cutting.

According to the first embodiment described above, in the expanding step, owing to the irradiation with UV rays, it is possible to cure the adhesive of the dicing tape S and to change the adhesion of the dicing tape S and, therefore, the elongation of the dicing tape S can be performed uniformly all over the surface of the wafer W. As a result of this, it is possible to manufacture an ultrathin chip with a good end-face shape in which uncut portions, chipping and breakage do not occur when chips T are obtained by dividing the wafer W along the modified region K.

Next, the second embodiment of the present invention will be described on the basis of FIG. 5. This second embodiment differs from the above-described first embodiment only in the expanding step. Therefore, detailed descriptions of other common steps are omitted.

Figure 5:
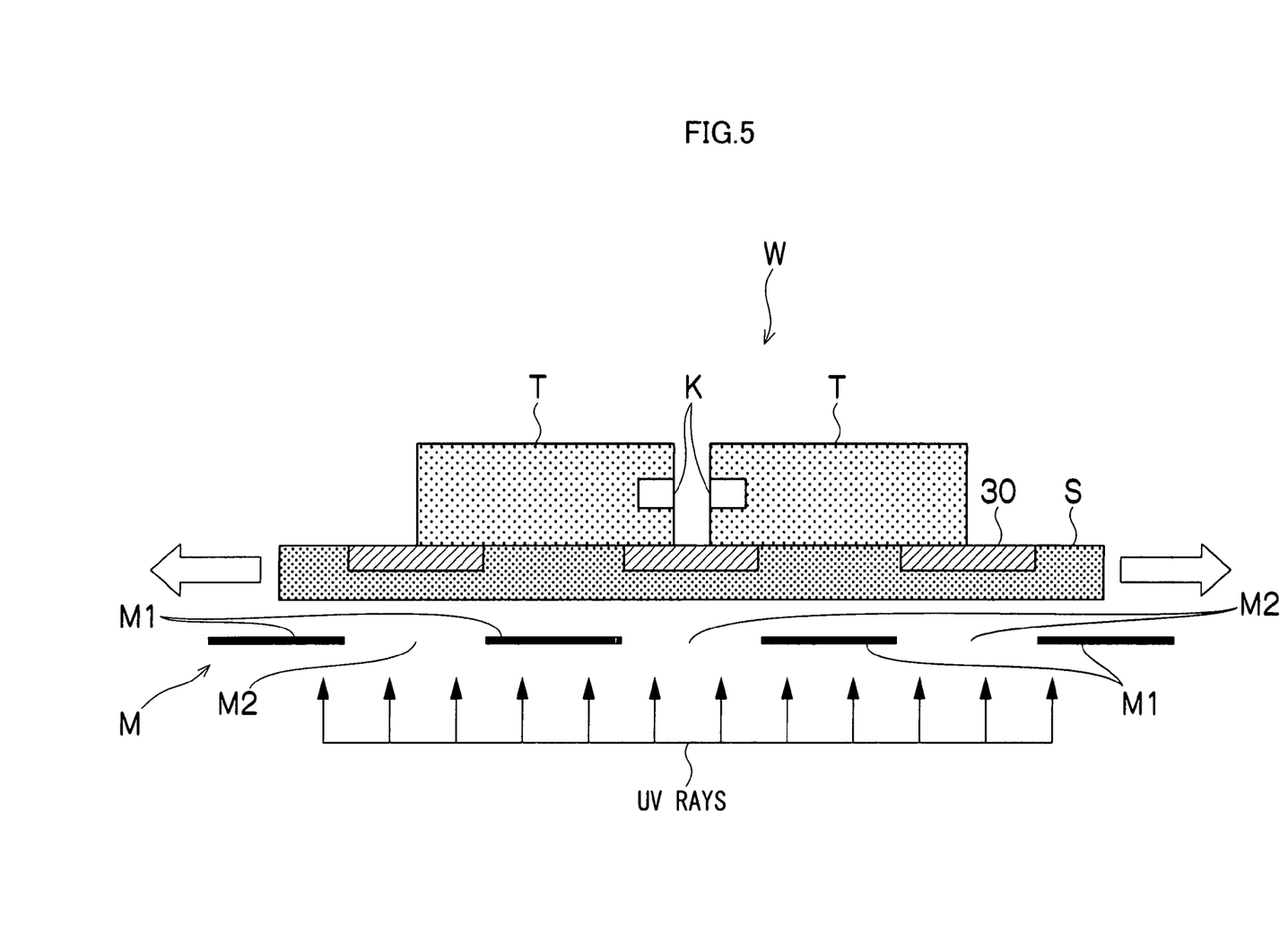
FIG. 5 is a conceptual diagram which shows an outline of the second embodiment of a method for dividing a plate-like member related to the present invention.

In the construction shown in FIG. 5, a photomask M is disposed at the bottom surface of the dicing tape S in addition to the arrangement of the first embodiment. Because other parts are the same as the dividing apparatus 20 shown in FIG. 4, the illustration of this dividing apparatus 20 and detailed descriptions of each part of this dividing apparatus 20 are omitted.

It is possible to adopt, as the photomask M, various kinds of photomasks such as glass masks (made of synthetic quartz, low-thermal-expansion glass, soda lime glass, etc.), film masks (made of a polyester film etc.), and metal masks according to accuracy, cost, etc.

In the construction shown in FIG. 5, the photomask M is arranged in such a manner that square-shaped light shielding portions M1 cover the middle part of each of divided chips T when the photomask M is plan-viewed. That is, the arrangement is such that portions of the dicing tape S corresponding to the peripheral edge portion of each of the chips T which are divided are irradiated with UV rays which have transmitted through the light transmissive portions M2 of the photomask M. In this case, as shown in the figure, the adhesive of the dicing tape S in these portions become irradiated portions 30.

UV rays are radiated from the UV ray source 24 (refer to FIG. 4) at the dicing tape S via the photomask M and, at the same time, the frame F is pushed down (refer to FIG. 4). Due to the irradiation with the UV rays, the adhesion of the irradiated portion 30 of the dicing tape S decreases.

Simultaneously, the dicing tape S is expanded and the gap between chips T is widened. At this time, because the dicing tape S corresponding to the peripheral edge portion of each of the chips T is the irradiated portion 30 and the adhesion of the adhesive in this portion decreases, the dicing tape S near portions of chips T which are to be cut is selectively expanded. That is, the expanding force of the dicing tape S is efficiently transmitted as a dividing force to the wafer W. As a result of this, the dividing of the chips T can be performed all over the surface of the wafer W without generating uncut portions when chips T are obtained by dividing the wafer W along the modified region K.

For the irradiation conditions with UV rays, such as irradiation capacity (electric power), wavelength range and irradiation time, appropriate values can be selected according to the material quality of the adhesive of the dicing tape S, the size of the wafer W and the size of chips T after cutting.

According to the above-described second embodiment, in the expanding step, due to the irradiation with the UV rays through the photomask M, the adhesion of the dicing tape S can be selectively reduced in the irradiated portion 30 and the expanding force of the dicing tape S can be efficiently transmitted as a dividing force to the wafer W all over the surface of the wafer W. As a result of this, it is possible to manufacture an ultrathin chip with a good end-face shape in which uncut portions, chipping and breakage do not occur when chips T are obtained by dividing the wafer W along the linear modified region K.

Incidentally, in the second embodiment, it is also possible to use a dicing tape S of high adhesion.

Next, the third embodiment related to the present invention will be described on the basis of FIG. 6. This third embodiment differs from the above-described first and second embodiments only in the expanding step. Therefore, detailed descriptions of other common steps are omitted.

Figure 6:
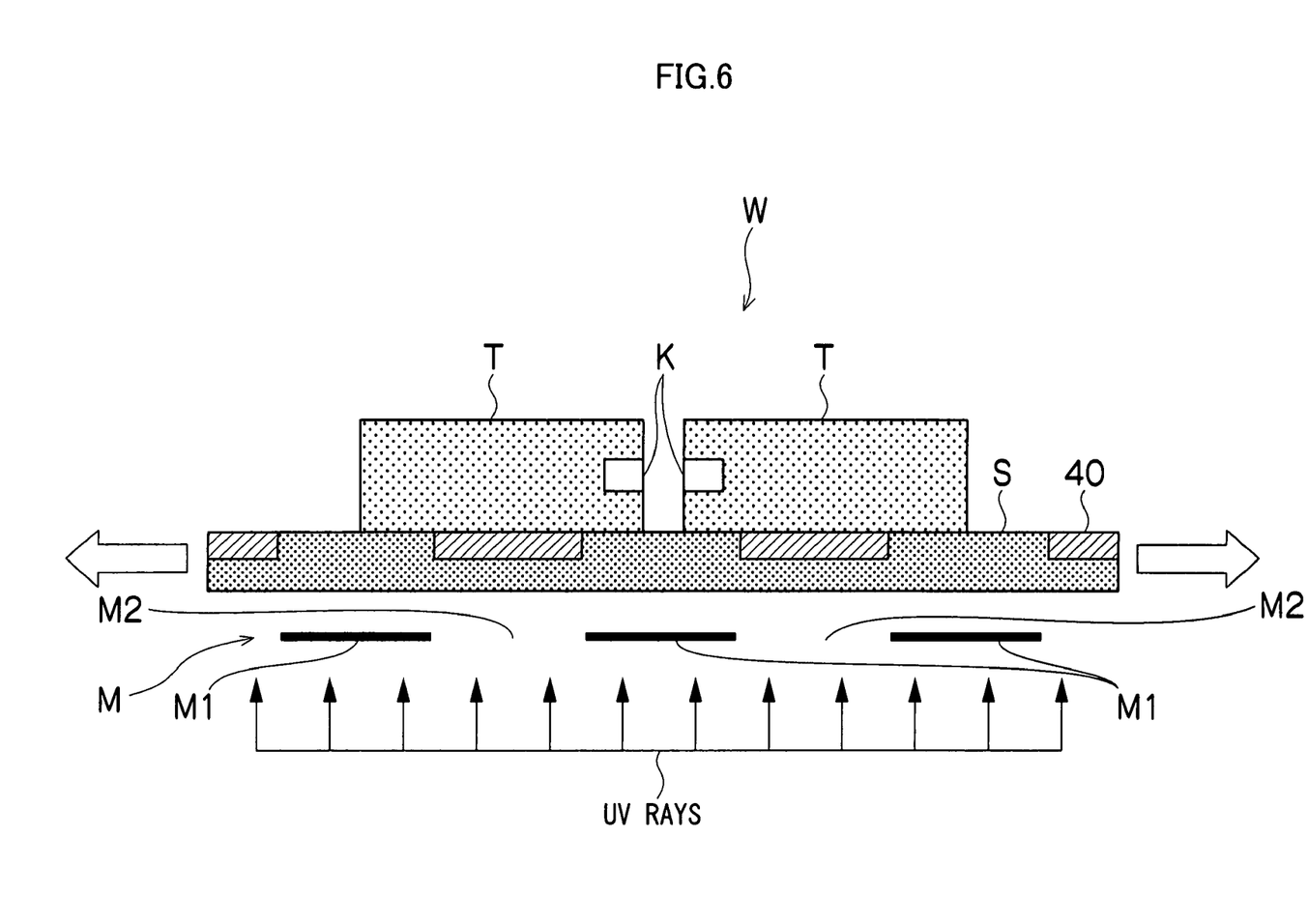
FIG. 6 is a conceptual diagram which shows an outline of the third embodiment of a method for dividing a plate-like member related to the present invention.

In the construction shown in FIG. 6, a photomask M is disposed at the bottom surface of the dicing tape S in addition to the arrangement of the first embodiment. Because other parts are the same as the dividing apparatus 20 shown in FIG. 4, the illustration of this dividing apparatus 20 and detailed descriptions of each part of this dividing apparatus 20 are omitted.

In the same way as in the second embodiment it is possible to adopt, as the photomask M, various kinds of photomasks such as glass masks (made of synthetic quartz, low-thermal-expansion glass, soda lime glass, etc.), film masks (made of a polyester film etc.), and metal masks according to accuracy, cost, etc.

In the construction shown in FIG. 6, the photomask M is arranged in such a manner that frame-like light shielding portions M1 cover the peripheral edge portion of each of divided chips T when the photomask M is plan-viewed. That is, the arrangement is such that portions of the dicing tape S corresponding to the center part of each of the chips T to be divided are irradiated with UV rays which have transmitted through the light transmissive portions M2 of the photomask M. In this case, as shown in the figure, the adhesive of the dicing tape S in these portions become irradiated portions 40.

UV rays are radiated from the UV ray source 24 (refer to FIG. 4) at the dicing tape S via the photomask M and, at the same time, the frame F is pushed down (refer to FIG. 4). Due to the irradiation with the UV rays, the curing of the irradiated portion 40 of the dicing tape S is promoted.

Simultaneously, the dicing tape S is expanded and the gap between chips T is widened. At this time, because the dicing tape S corresponding to the center part of each of the chips T is the irradiated portion 40 and the curing of this portion is promoted, the dicing tape S of this portion tends to be less expanded and the dicing tape S near portions of chips T which are to be cut is selectively expanded, these portions being portions other than the irradiated portion 40. That is, the expanding force of the dicing tape S is efficiently transmitted as a dividing force to the wafer W. As a result of this, in dividing the wafer W, the dividing of the chips T can be performed all over the surface of the wafer W without generating uncut portions.

For the irradiation conditions with UV rays, such as irradiation capacity (electric power), wavelength range and irradiation time, appropriate values can be selected according to the material quality of the adhesive of the dicing tape S, the size of the wafer W and the size of chips T after cutting.

According to the above-described third embodiment, in the expanding step, due to the irradiation with the UV rays through the photomask M, the curing of the dicing tape S can be selectively promoted in the irradiated portion 40 and the expanding force of the dicing tape S can be efficiently transmitted as a dividing force to the wafer W all over the surface of the wafer W. As a result of this, it is possible to manufacture an ultrathin chip with a good end-face shape in which uncut portions, chipping and breakage do not occur when the wafer W is divided along the modified region K to obtain each chip. Furthermore, according to the third embodiment, the advantage that the exfoliation of chips T does not easily occur in the expanding step is also obtained.

Although embodiments of a method and an apparatus for dividing a plate-like member related to the present invention have been described above, the present invention is not limited to the above-described embodiments and it is possible to adopt various modes.

For example, in the examples of the embodiments, a laser dicing device is used in the modified region forming step in which a modified region is formed on the surface of a wafer W to which a dicing tape S is stuck or in the interior of the wafer W. However, in the modified region forming step, a modified region may be formed by using other devices, for example, a dicing saw.

Also, in the examples of the embodiments, the descriptions were given of a case where a plate-like member formed from a hard and brittle material is used in the wafer W. However, the dividing method and dividing apparatus of a plate-like member of the present invention can also be applied to the dividing of other various kinds of hard and brittle materials, for example, glass substrates used in various kinds of display elements (LC, EL, etc.). In the dividing of such glass substrates by scribing, the occurrence of flaws due to the formation of glass chips was a big problem. In the present invention, however, it is possible to effectively cope with this problem.

In the examples of the embodiments, the descriptions were given of an example in which ultrathin chips are obtained by working an ultrathin wafer having a thickness of 30 µm to 100 µm or so. However, the method of dividing a plate-like member of the present invention can also be applied to chips of not less than 100 µm.

INDUSTRIAL APPLICABILITY

As described above, according to the present invention, in the expanding step, tape is irradiated with UV rays (light in the wavelength range of ultraviolet rays). As a result of this, it is possible to cure the adhesive of the tape and to change the adhesion of the tape and the elongation of the dicing tape S can be made uniform all over the surface of the wafer W. As a result of this, it is possible to positively manufacture an ultrathin chip with a good end-face shape in which uncut portions, chipping and breakage do not occur when multiple substrates are obtained by dividing the plate-like member along the linear modified region.

Also, according to the present invention, it is necessary only that UV ray irradiation means be added to a conventional device for dividing a plate-like member, and the construction of the apparatus can be made simple. The dividing work of a plate-like member becomes also simple. As a result, it becomes possible to miniaturize the apparatus for dividing a plate-like member and the dividing work of a plate-like member can be performed in a short time.

The invention claimed is:

1. A method for dividing a plate-shaped member formed from a hard and brittle material, comprising the steps of:
   sticking tape on a surface of the plate-shaped member;
   forming a linear modified region on the surface of the plate-shaped member to which the tape has been stuck or in the interior thereof;
   irradiating only selected portions of the tape corresponding to the peripheral edge portion of each of the chips so as to decrease adhesion of the sticking tape in the irradiated peripheral edge portion,
   selectively elongating the tape near peripheral edge portions of chips which are to be cut by applying a tension thereto after forming the linear modified region while simultaneously irradiating the tape with UV rays, whereby the plate-shaped member is divided along the linear modified region thereby to obtain multiple substrates all over the surface of the wafer W without generating uncut portions.

2. The method for dividing a plate-shaped member according to claim 1, wherein said irradiating step is performed using UV light in a pattern set using a photomask.

3. The method for dividing a plate-shaped member according to claim 2, wherein the photomask is configured and arranged in a manner causing square-shaped light shielding portions to cover areas of the plate-shaped member that within the peripheral edge portion of each of the divided chips produced.

4. The method for dividing a plate-shaped member according to claim 2, wherein the photomask is configured and arranged in a manner causing frame-shaped light shielding portions to cover areas of the plate-shaped member that within the peripheral edge portion of each of the divided chips produced.

5. The method for dividing a plate-shaped member according to claim 1, wherein the step of forming a linear modified region is performed by causing laser beams to become incident on the surface of the plate-shaped member.

6. The method for dividing a plate-shaped member according to claim 1, wherein the tape has an ultraviolet curing adhesive, and wherein the adhesive of the tape is cured and the adhesion of the tape to the plate-shaped member reduced by radiating thereof with UV rays.

* * * * *